(12) United States Patent
Xu

(10) Patent No.: US 11,870,437 B2
(45) Date of Patent: Jan. 9, 2024

(54) OUTPUT DRIVING CIRCUIT AND MEMORY

(71) Applicant: CHANGXIN MEMORY TECHNOLOGIES, INC., Hefei (CN)

(72) Inventor: Yan Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 66 days.

(21) Appl. No.: 17/595,717

(22) PCT Filed: Feb. 8, 2021

(86) PCT No.: PCT/CN2021/075940
§ 371 (c)(1),
(2) Date: Nov. 23, 2021

(87) PCT Pub. No.: WO2021/190190
PCT Pub. Date: Sep. 30, 2021

(65) Prior Publication Data
US 2022/0255548 A1   Aug. 11, 2022

(30) Foreign Application Priority Data

Mar. 23, 2020 (CN) .......................... 202010207543.6

(51) Int. Cl.
*H03K 19/017* (2006.01)
*G11C 7/10* (2006.01)
*H03K 19/20* (2006.01)

(52) U.S. Cl.
CPC ..... *H03K 19/01721* (2013.01); *G11C 7/1057* (2013.01); *H03K 19/20* (2013.01)

(58) Field of Classification Search
None
See application file for complete search history.

(56) References Cited

U.S. PATENT DOCUMENTS

| 5,128,555 A * | 7/1992 | Millman .......... H03K 19/01721 |
|---|---|---|
| | | 326/88 |
| 6,087,870 A | 7/2000 | Sakamoto |

(Continued)

FOREIGN PATENT DOCUMENTS

| CN | 1200572 A | 12/1998 |
|---|---|---|
| CN | 1821925 A | 8/2006 |

(Continued)

OTHER PUBLICATIONS

International Search Report as cited in PCT Application No. PCT/CN2021/075940 dated Apr. 28, 2021, 5 pages.

(Continued)

*Primary Examiner* — Jany Richardson
(74) *Attorney, Agent, or Firm* — Cooper Legal Group, LLC

(57) ABSTRACT

The present application provides an output driving circuit and a memory. The output driving circuit includes: a signal input terminal inputting a positive input signal and a negative input signal complementary to each other; a pull-up output unit and a pull-down output unit connected to the signal input terminal, the positive input signal acting as an input signal of the pull-up output unit, and the negative input signal acting as an input signal of the pull-down output unit; at least one compensation unit connected in parallel with the pull-up or pull-down output unit; at least one pulse signal generation circuit, and generating a pulse signal, the pulse signal acting as a control signal of the compensation unit; and a signal output terminal connected to an output terminal of the pull-up output unit, an output terminal of the pull-down output unit and an output terminal of the compensation unit.

17 Claims, 2 Drawing Sheets

(56) References Cited

U.S. PATENT DOCUMENTS

| | | | |
|---|---|---|---|
| 6,091,260 | A | 7/2000 | Shamarao |
| 6,229,365 | B1 | 5/2001 | Iketani |
| 8,471,602 | B2 | 6/2013 | Lee |
| 10,756,737 | B1 | 8/2020 | Wu |
| 11,128,283 | B1 * | 9/2021 | Kang ................. H04L 25/0286 |
| 2003/0112042 | A1 | 6/2003 | Takahashi |

FOREIGN PATENT DOCUMENTS

| | | |
|---|---|---|
| CN | 107919154 A | 4/2018 |
| CN | 211744448 U | 10/2020 |
| DE | 19757959 A1 | 12/1998 |
| KR | 20050003895 A | 1/2005 |

OTHER PUBLICATIONS

Written Opinion cited in PCT/CN2021/075940, dated Apr. 28, 2021, 14 pages.
Supplementary European Search Report in the European application No. 21773281.7, dated Aug. 9, 2023. 10 pages.

\* cited by examiner

OUTPUT DRIVING CIRCUIT AND MEMORY

CROSS-REFERENCE TO RELATED APPLICATIONS

This application claims priority to Chinese Patent Application No. 202010207543.6, entitled "OUTPUT DRIVING CIRCUIT AND MEMORY" and filed on Mar. 23, 2020, the entire contents of which are incorporated herein by reference.

TECHNICAL FIELD

The present invention relates to the field of integrated circuits, in particular to an output driving circuit and a memory.

BACKGROUND

With the continuous development of a DRAM, its transmission rate is getting higher and higher. However, due to limitation by a rate of a logic device in a memory process, it is difficult to improve a slew rate of an output signal of a high-speed output port DQ/DQS of the DRAM, which seriously affects the quality of a high-speed signal; as a result, an input terminal cannot receive the signal correctly, thereby affecting the increase in a final transmission rate.

Therefore, how to increase the slew rate of the output signal of the high-speed output port DQ/DQS of the DRAM is an urgent problem to be solved currently.

SUMMARY

The technical problem to be solved by the present application is to provide an output driving circuit and a memory that can increase a slew rate of an output signal of the memory and then greatly increase a transmission rate of the memory.

To solve the above problem, the present application provides an output driving circuit, including: a signal input terminal inputting a positive input signal and a negative input signal complementary to each other; a pull-up output unit connected to the signal input terminal, the positive input signal acting as an input signal of the pull-up output unit; a pull-down output unit connected to the signal input terminal, the negative input signal acting as an input signal of the pull-down output unit; at least one compensation unit connected in parallel with the pull-up output unit or the pull-down output unit; at least one pulse signal generation circuit having an input terminal connected to the signal input terminal, and generating a pulse signal based on the positive input signal or the negative input signal, the pulse signal acting as a control signal of the compensation unit; and a signal output terminal connected to an output terminal of the pull-up output unit, an output terminal of the pull-down output unit and an output terminal of the compensation unit, and outputting an output signal.

Further, a pulse width of the pulse signal is less than that of the positive input signal or the negative input signal.

Further, the pulse signal generation circuit generates the pulse signal through a rising edge or a falling edge of the positive input signal or the negative input signal.

Further, a pulse width of the pulse signal is less than or equal to a rising edge time or a falling edge time of the output signal.

Further, the pulse signal generation circuit includes a first delay branch, a second delay branch and an AND circuit, the first delay branch is connected in parallel with the second delay branch and then connected in series with the AND circuit, the positive input signal or the negative input signal acts as input signals of the first delay branch and the second delay branch, output signals of the first delay branch and the second delay branch act as an input signal of the AND circuit together, the AND circuit outputs the pulse signal, and the first delay branch and the second delay branch have different delay times.

Further, the first delay branch includes at least a NOT gate and a first delay unit connected in series, the second delay branch includes at least a second delay unit, and the delay times of the first delay unit and the second delay unit are adjusted to change a pulse width of the pulse signal.

Further, the output driving circuit further includes at least one delay unit, the delay unit is arranged at the input terminal of the pulse signal generation circuit, and the positive input signal or the negative input signal is inputted to the pulse signal generation circuit through the delay unit.

Further, the output driving circuit includes two compensation units that are a pull-up compensation unit and a pull-down compensation unit respectively, the pull-up compensation unit is connected in parallel with the pull-up output unit, and the pull-down compensation unit is connected in parallel with the pull-down output unit.

Further, the output driving circuit includes two pulse signal generation circuits that are a pull-up pulse signal generation circuit and a pull-down pulse signal generation circuit respectively, the pull-up pulse signal generation circuit generates a first pulse signal based on the positive input signal, the first pulse signal acts as a control signal of the pull-up compensation unit, the pull-down pulse signal generation circuit generates a second pulse signal based on the negative input signal, and the second pulse signal acts as a control signal of the pull-down compensation unit.

Further, the pull-up output unit includes one first transistor or a plurality of first transistors arranged in parallel, the first transistor including a first terminal, a second terminal and a control terminal; the pull-up compensation unit includes one second transistor or a plurality of second transistors arranged in parallel, the second transistor including a first terminal, a second terminal and a control terminal; the first terminals of the first transistor and the second transistor are connected to a power supply voltage, the second terminals of the first transistor and the second transistor are connected to the signal output terminal, the control terminal of the first transistor is connected to the signal input terminal, and the control terminal of the second transistor is connected to the pull-up pulse signal generation circuit.

Further, the pull-down output unit includes one third transistor or a plurality of third transistors arranged in parallel, the third transistor including a first terminal, a second terminal and a control terminal; the pull-down compensation unit includes one fourth transistor or a plurality of fourth transistors arranged in parallel, the fourth transistor including a first terminal, a second terminal and a control terminal; the first terminals of the third transistor and the fourth transistor are grounded, the second terminals of the third transistor and the fourth transistor are connected to the signal output terminal, the control terminal of the third transistor is connected to the signal input terminal, and the control terminal of the fourth transistor is connected to the pull-down pulse signal generation circuit.

Further, the output driving circuit further includes a pull-up pre-amplification unit and a pull-down pre-amplification unit; the pull-up pre-amplification unit includes a first terminal and a second terminal, the first terminal is connected to the positive input signal, and the second terminal is connected to the control terminal of the pull-up output unit; the pull-down pre-amplification unit includes a first terminal and a second terminal, the first terminal is connected to the negative input signal, the second terminal is connected to the control terminal of the pull-down output unit, and the input terminal of the pulse signal generation circuit is connected to the second terminal of the pull-up pre-amplification unit or the second terminal of the pull-down pre-amplification unit.

Further, the output driving circuit further includes a pull-up impedance calibration unit and a pull-down impedance calibration unit, the pull-up impedance calibration unit is connected in parallel with the pull-up output unit, and the pull-down impedance calibration unit is connected in parallel with the pull-down output unit.

Further, the output driving circuit includes a plurality of parallel driving modules, the driving module including at least the signal input terminal, the pull-up output unit, the pull-down output unit, the compensation unit and the signal input terminal.

Further, the plurality of driving modules share the same pulse signal generation circuit.

The present application further provides a memory including the output driving circuit as described above.

The present application has the following advantages. The compensation unit is controlled to be turned on by using the pulse signal generated by the pulse signal generation circuit to add an additional current to the pull-up output unit or the pull-down output unit, so as to increase the slew rate of the output signal of the output driving circuit.

An output signal of the pull-up compensation unit and an output signal of the pull-up output unit act as a positive output signal of the signal output terminal together, and an output signal of the pull-down compensation unit and an output signal of the pull-down output unit act as a negative output signal of the signal output terminal together. In the present application, the compensation unit is controlled to be turned on through the pulse signal generation circuit, and then the pull-up output unit and the pull-down output unit are compensated, which increases a slew rate of an output signal finally outputted by additionally adding a current generated by the compensation unit while signal conversion is performed.

BRIEF DESCRIPTION OF DRAWINGS

In order to more clearly illustrate the technical solutions in embodiments of the present application, the accompanying drawings used in the description of the embodiments of the present application will be briefly introduced below. It is apparent that, the accompanying drawings in the following description are only some embodiments of the present application, and other drawings can be obtained by those of ordinary skill in the art from the provided drawings without creative efforts.

DESCRIPTION OF EMBODIMENTS

In order to make the objectives, technical means and effects of the present application clearer, the present application will be further elaborated below with reference to the accompanying drawings. It should be understood that the embodiments described herein are only part of the embodiments of the present application but not all the embodiments of the present application, and are not intended to limit the present application. All other embodiments obtained by those skilled in the art based on the embodiments of the present application without creative efforts fall within the protection scope of the present application.

Figure 1:
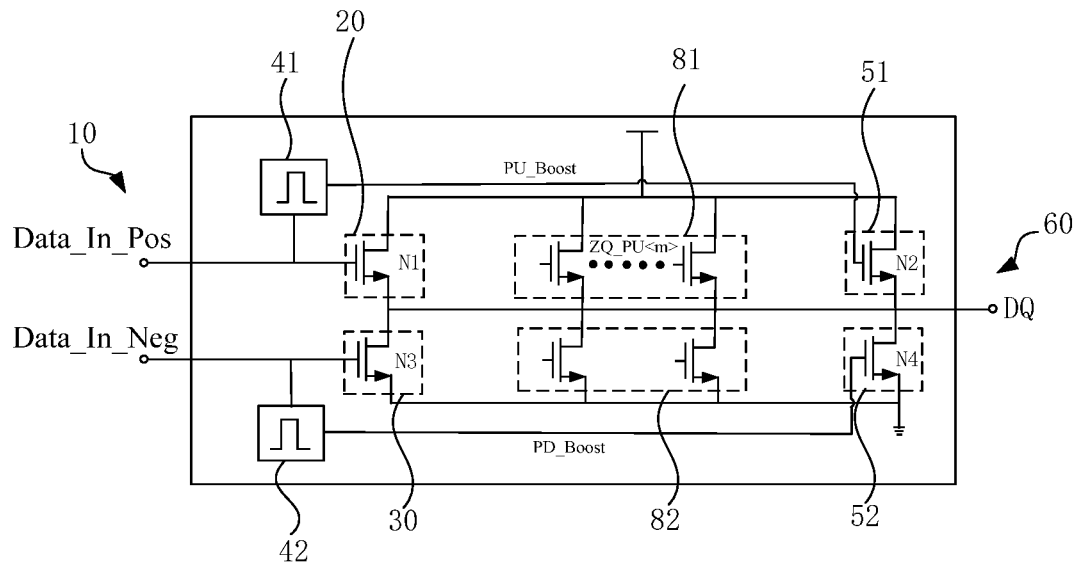
FIG. 1 is a schematic diagram of a first embodiment of an output driving circuit according to the present application.

FIG. 1 is a schematic diagram of a first embodiment of an output driving circuit according to the present application. Referring to FIG. 1, the output driving circuit according to the present application includes a signal input terminal 10, a pull-up output unit 20, a pull-down output unit 30, at least one pulse signal generation circuit, at least one compensation unit and a signal output terminal 60.

The signal input terminal 10 can provide an input signal. The input signal includes a positive input signal Data_In_Pos and a negative input signal Data_In_Neg complementary to each other. The input signal is a signal after parallel-serial conversion by a pre-amplifier.

The positive input signal Data_In_Pos and the negative input signal Data_In_Neg are set as complementary signals so that the pull-up output unit 20 and the pull-down output unit 30 are not turned on at the same time, so as to form an output signal DQ. One method for setting the positive input signal Data_In_Pos and the negative input signal Data_In_Neg to be complementary is to enable a control signal input terminal to directly output the positive input signal Data_In_Pos and the negative input signal Data_In_Neg complementary to each other. Another method is to set the pull-up output unit 20 and the pull-down output unit 30 to be of different transistor types so that an input signal of the pull-up output unit 20 and an input signal of the pull-down output unit 30 are complementary input signals. The pull-up output unit 20 is connected to the signal input terminal 10. The positive input signal Data_In_Pos acts as the input signal of the pull-up output unit 20. An output terminal of the pull-up output unit 20 is connected to the signal output terminal 60. The pull-up output unit 20 may consist of one first transistor or a plurality of parallel first transistors. Specifically, in this embodiment, the pull-up output unit 20 consists of one first transistor N1, and the first transistor N1 is an NMOS transistor. The first transistor N1 includes a first terminal, a second terminal and a control terminal. The first terminal of the first transistor N1 is a drain and connected to a power supply voltage, the second terminal of the first transistor N1 is a source and connected to the signal output terminal 60, and the control terminal of the first transistor N1 is a gate and connected to the signal input terminal 10. The positive input signal Data_In_Pos acts as an input signal of the gate. In other embodiments of the present application, the first transistor N1 may also be a PMOS transistor.

The pull-down output unit 30 is connected to the signal input terminal 10. The negative input signal Data_In_Neg acts as the input signal of the pull-down output unit 30. An output terminal of the pull-down output unit 30 is connected to the signal output terminal 60. The pull-down output unit 30 may consist of one third transistor N3 or a plurality of parallel third transistors N3. Specifically, in this embodiment, the pull-down output unit 30 consists of one third transistor N3, and the third transistor N3 is an NMOS transistor. The third transistor N3 includes a first terminal, a second terminal and a control terminal. The first terminal of the third transistor N3 is a source and connected to a ground terminal, the second terminal of the third transistor N3 is a drain and connected to the signal output terminal 60, and the control terminal of the third transistor N3 is a gate and connected to the signal input terminal 10. The negative input signal Data_In_Neg acts as an input signal of the gate. In other embodiments of the present application, the third transistor N3 may also be a PMOS transistor.

The compensation unit is connected in parallel with the pull-up output unit 20 or the pull-down output unit 30. In this embodiment, the output driving circuit includes two compensation units that are a pull-up compensation unit 51 and a pull-down compensation unit 52 respectively. The pull-up compensation unit 51 is connected in parallel with the pull-up output unit 20, and the pull-down compensation unit 52 is connected in parallel with the pull-down output unit 30.

The pulse signal generation circuit has an input terminal connected to the signal input terminal 10, and generates a pulse signal based on the positive input signal Data_In_Pos and the negative input signal Data_In_Neg. The pulse signal acts as a control signal of the compensation unit. The pulse signal generation circuit may be arranged according to the compensation unit. For example, if only the pull-up compensation unit 51 is arranged, only the pulse signal generation circuit corresponding to the pull-up compensation unit 51 may be arranged; if only the pull-down compensation unit 52 is arranged, only the pulse signal generation circuit corresponding to the pull-down compensation unit 52 may be arranged. In this embodiment, both the pull-up compensation unit 51 and the pull-down compensation unit 52 are arranged, and then the pulse signal generation circuit is also arranged as a pull-up pulse signal generation circuit 41 and a pull-down pulse signal generation circuit 42. The pull-up pulse signal generation circuit 41 generates a first pulse signal PU_Boost based on the positive input signal Data_In_Pos. The pull-down pulse signal generation circuit 42 generates a second pulse signal PD_Boost based on the negative input signal Data_In_Neg.

An input terminal of the pull-up compensation unit 51 is connected to the pull-up pulse signal generation circuit 41. The first pulse signal PU_Boost acts as an input signal of the pull-up compensation unit 51. An output terminal of the pull-up compensation unit 51 is connected to the signal output terminal 60. The pull-up compensation unit 51 may consist of one second transistor N2 or a plurality of parallel second transistors N2. Specifically, in this embodiment, the pull-up compensation unit 51 consists of one second transistor N2, and the second transistor N2 is an NMOS transistor. The second transistor N2 includes a first terminal, a second terminal and a control terminal. The first terminal of the second transistor N2 is a drain and connected to a power supply voltage, the second terminal of the second transistor N2 is a source and connected to the signal output terminal 60, and the control terminal of the second transistor N2 is a gate and connected to the pull-up pulse signal generation circuit 41. The first pulse signal PU_Boost acts as an input signal of the gate. In other embodiments of the present application, the second transistor N2 may also be a PMOS transistor.

It may be understood that in this embodiment, the pull-up compensation unit 51 and the pull-up output unit 20 are of the same transistor type. In other embodiments of the present application, the pull-up compensation unit 51 and the pull-up output unit 20 may be of different transistor types, provided that the objective of the present application can be achieved. For example, the pull-up compensation unit 51 is an NMOS transistor and the pull-up output unit 20 is a PMOS transistor, or the pull-up compensation unit 51 is a PMOS transistor and the pull-up output unit 20 is a NMOS transistor. An input terminal of the pull-down compensation unit 52 is connected to the pull-down pulse signal generation circuit 42. The second pulse signal PD_Boost acts as an input signal of the pull-down compensation unit 52. An output terminal of the pull-down compensation unit 52 is connected to the signal output terminal 60. The pull-down compensation unit 52 may consist of one fourth transistor N4 or a plurality of parallel fourth transistors N4. Specifically, in this embodiment, the pull-down compensation unit 52 consists of one fourth transistor N4, and the fourth transistor N4 is an NMOS transistor. The fourth transistor N4 includes a first terminal, a second terminal and a control terminal. The first terminal of the fourth transistor N4 is a source and connected to the ground terminal, the second terminal of the fourth transistor N4 is a drain and connected to the signal output terminal 60, and the control terminal of the fourth transistor N4 is a gate and connected to the pull-down pulse signal generation circuit 42. The second pulse signal PD_Boost acts as an input signal of the gate. In other embodiments of the present application, the fourth transistor N4 may also be a PMOS transistor.

It may be understood that in this embodiment, the pull-down compensation unit 52 and the pull-down output unit 30 are of the same transistor type. In other embodiments of the present application, the pull-down compensation unit 52 and the pull-down output unit 30 may be of different transistor types, provided that the objective of the present application can be achieved. For example, the pull-down compensation unit 52 is an NMOS transistor and the pull-down output unit 30 is a PMOS transistor, or the pull-down compensation unit 52 is a PMOS transistor and the pull-down output unit 30 is a NMOS transistor.

Further, the pulse signal generation circuit generates the pulse signal through a rising edge or a falling edge of the positive input signal Data_In_Pos or the negative input signal Data_In_Neg. For example, if the pull-up output unit 20 and the pull-down output unit 30 are NMOS transistors, the pull-up pulse signal generation circuit 41 generates the first pulse signal PU_Boost through the rising edge of the positive input signal Data_In_Pos. The pull-down pulse signal generation circuit 42 generates the second pulse signal PD_Boost through the rising edge of the negative input signal Data_In_Neg. If the pull-up output unit 20 and the pull-down output unit 30 are PMOS transistors, the pull-up pulse signal generation circuit 41 generates the first pulse signal PU_Boost through the falling edge of the positive input signal Data_In_Pos. The pull-down pulse signal generation circuit 42 generates the second pulse signal PD_Boost through the falling edge of the negative input signal Data_In_Neg.

Figure 2:
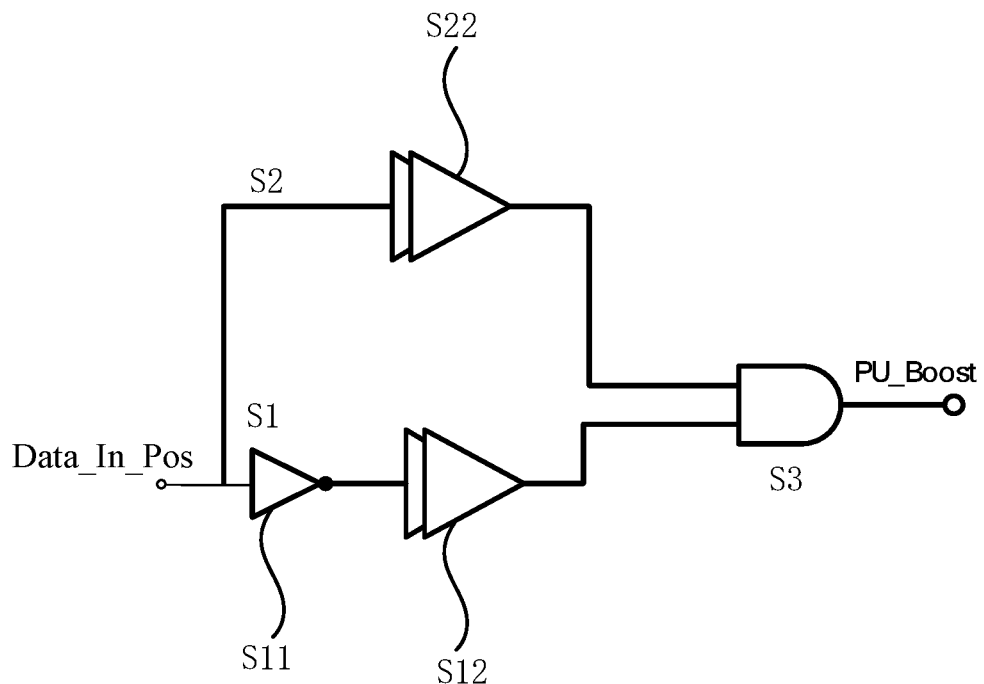
FIG. 2 is a circuit diagram of an embodiment of a pulse signal generation circuit according to the present application.

FIG. 2 is a circuit diagram of an embodiment of a pulse signal generation circuit. Referring to FIG. 2, the pulse signal generation circuit includes a first delay branch S1, a second delay branch S2 and an AND circuit S3. The first delay branch S1 is connected in parallel with the second delay branch S2 and then connected in series with the AND circuit S3.

The positive input signal Data_In_Pos or the negative input signal Data_In_Neg acts as input signals of the first delay branch S1 and the second delay branch S2. Output signals of the first delay branch S1 and the second delay branch S2 act as an input signal of the AND circuit S3 together. The AND circuit S3 outputs the pulse signal. The first delay branch S1 and the second delay branch S2 have different delay times, so that the AND circuit S3 can output the pulse signal, for example, a first pulse signal PU_Boost or a second pulse signal PD_Boost.

Further, the first delay branch S1 includes at least a NOT gate S11 and a first delay unit S12 connected in series, and the second delay branch S2 includes at least a second delay unit S22. A pulse width of the pulse signal outputted by the AND circuit S3 can be changed by adjusting the delay times of the first delay unit S12 and the second delay unit S22.

Further, the first delay unit S12 and the second delay unit S22 can be implemented by series connection with an inverter-based delay unit.

The signal output terminal 60 is connected to an output terminal of the pull-up output unit 20, an output terminal of the pull-up compensation unit 51, an output terminal of the pull-down output unit 30, and an output terminal of the pull-down compensation unit 52 to output an output signal DQ.

In the present application, an output signal of the pull-up compensation unit 51 and an output signal of the pull-up output unit 20 act as a positive output signal of the signal output terminal 60 together, and an output signal of the pull-down compensation unit 52 and an output signal of the pull-down output unit 30 act as a negative output signal of the signal output terminal 60 together.

Further, a pulse width of the first pulse signal PU_Boost generated by the pull-up pulse signal generation circuit 41 is less than that of the positive input signal Data_In_Pos, and a pulse width of the second pulse signal PD_Boost generated by the pull-down pulse signal generation circuit 42 is less than that of the negative input signal Data_In_Neg, to avoid the influence of the output of the pull-up compensation unit 51 and the pull-down compensation unit 52 on the normal output of the signal output terminal 60.

In the present application, the compensation unit is controlled to be turned on through the pulse signal generation circuit, and then the pull-up output unit 20 and the pull-down output unit 30 are compensated, which increases a slew rate of an output signal finally outputted by additionally adding a current generated by the compensation unit while signal conversion is performed.

Further, a pulse width of the pulse signal is less than or equal to a rising edge time or a falling edge time of the output signal DQ. That is, the pull-up compensation unit 51 and the pull-down compensation unit 52 can be turned on only when the output signal DQ is at a rising edge or falling edge stage, so as to save power consumption while increasing an output rate of the output signal. Specifically, in this embodiment, a pulse width of the first pulse signal PU_Boost is less than a rising edge time of the output signal DQ, and a pulse width of the second pulse signal PD_Boost is less than a falling edge time of the output signal DQ.

Figure 3:
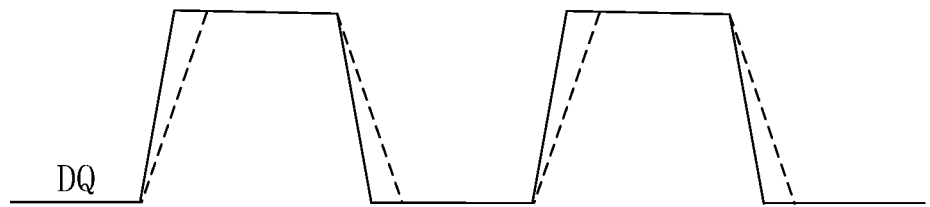
FIG. 3 is a schematic diagram of output signals DQ of a signal output terminal prior to and after compensation, in which the solid line is the output signal after compensation, and the dashed line is the output signal prior to compensation.

Specifically, refer to FIG. 3, which is a schematic diagram of output signals DQ of the signal output terminal 60 prior to and after compensation. The solid line is the output signal after compensation, and the dashed line is the output signal prior to compensation. It can be seen from FIG. 3 that the pull-up compensation unit 51 is turned on on the rising edge of the output signal, and the pull-down compensation unit 52 is turned on on the falling edge of the output signal. The slew rate of the rising edge and the falling edge of the output signal after compensation increases compared to that prior to compensation.

Further, the output driving circuit further includes at least one delay unit (not shown in the drawings), the delay unit is arranged at the input terminal of the pulse signal generation circuit, and the positive input signal Data_In_Pos or the negative input signal Data_In_Neg is inputted to the pulse signal generation circuit through the delay unit, to adjust a compensation size of the compensation unit, which can further control the slew rate of the output signal DQ. The delay unit may be implemented through RC delay or by series connection with an inverter-based delay unit.

Further, in the present application, not only can a compensation current of the compensation unit be changed by adjusting the pulse width of the pulse signal and then adjusting an ON time of the compensation unit by the pulse signal generation circuit, but also the magnitude of the compensation current of the compensation unit can be adjusted by adjusting the number and size of transistors included in the compensation unit.

Further, the output driving circuit further includes a pull-up impedance calibration unit 81 and a pull-down impedance calibration unit 82. An input signal of the pull-up impedance calibration unit 81 is ZQ_PU<m>, and an input signal of the pull-down impedance calibration unit 82 is ZQ_PD<m>. The pull-up impedance calibration unit 81 is connected in parallel with the pull-up output unit 20, and the pull-down impedance calibration unit 82 is connected in parallel with the pull-down output unit 30, so as to calibrate the pull-up output unit 20 and the pull-down output unit 30. The pull-up impedance calibration unit 81 may be formed by a plurality of transistors connected in parallel. The pull-down impedance calibration unit 82 may also be formed by a plurality of transistors connected in parallel.

Figure 4:
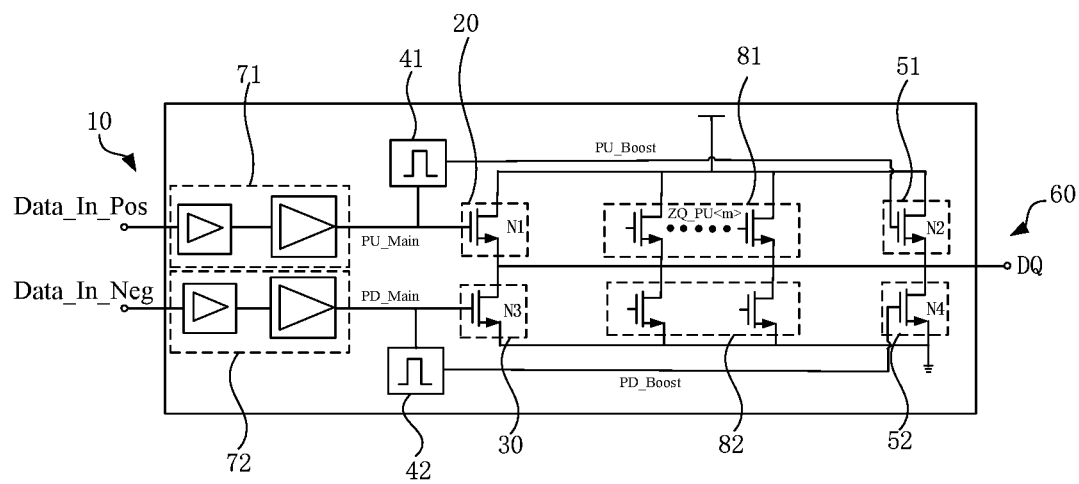
FIG. 4 is a schematic diagram of a second embodiment of the output driving circuit according to the present application.

The present application further provides another embodiment of an output driving circuit. Refer to FIG. 4, which is a schematic diagram of a second embodiment of the output driving circuit according to the present application. The second embodiment is different from the first embodiment in that the output driving circuit further includes a pull-up pre-amplification unit 71 and a pull-down pre-amplification unit 72.

The pull-up pre-amplification unit 71 includes a first terminal and a second terminal. The first terminal is connected to the positive input signal Data_In_Pos, and the second terminal is connected to the control terminal of the pull-up output unit 20. At the same time, the second terminal may also be connected to the input terminal of the pulse signal generation circuit. Specifically, in this embodiment, the second terminal is connected to the pull-up pulse signal generation circuit 41. An output signal PU_Main generated by the pull-up pre-amplification unit 71 acts as input signals of the pull-up output unit 20 and the pull-up pulse signal generation circuit 41.

The pull-down pre-amplification unit 72 includes a first terminal and a second terminal. The first terminal is connected to the negative input signal Data_In_Neg, and the second terminal is connected to the control terminal of the pull-down output unit 30. At the same time, the second terminal may also be connected to the input terminal of the pulse signal generation circuit. Specifically, in this embodiment, the second terminal is connected to the pull-down pulse signal generation circuit 42. An output signal PD_Main generated by the pull-down pre-amplification unit 72 acts as input signals of the pull-down output unit 30 and the pull-down pulse signal generation circuit 42.

Figure 5:
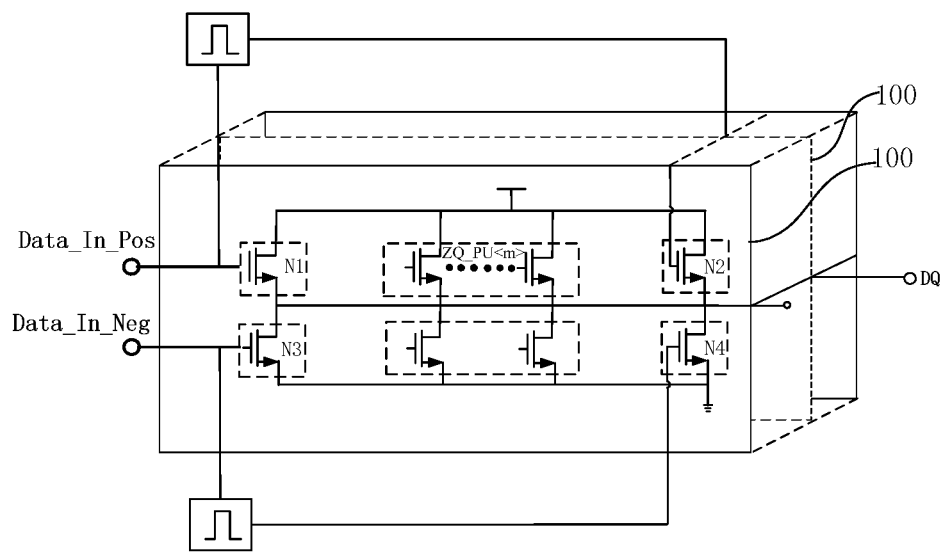
FIG. 5 is a schematic diagram of a third embodiment of the output driving circuit according to the present application.

The present application further provides a third embodiment of the output driving circuit. FIG. 5 is a schematic diagram of a third embodiment of the output driving circuit according to the present application. Referring to FIG. 5, the output driving circuit includes a plurality of driving modules 100. The driving modules 100 are arranged in parallel, and the driving modules 100 have the same layout. In the output driving circuit according to the present application, the driving modules 100 are multiplexed, which can greatly simplify the design of the circuit and the realization of the layout, improve a degree of matching between the driving modules, and reduce the parasitism between the circuits, especially high-speed signal lines, so as to improve the performance of the circuit under high-speed operation.

The driving module 100 includes at least the signal input terminal 10, the pull-up output unit 20, the pull-down output unit 30, the compensation unit and the signal input terminal 10. The pulse signal generation circuit may act as part of the output driving circuit, or the plurality of driving modules 100 can share the same pulse signal generating circuit. In this embodiment, the plurality of driving modules 100 share the same pulse signal generating circuit, so as to save power consumption. Further, the driving module 100 may also include a pull-up pre-amplification unit 71 and a pull-down pre-amplification unit 72.

The signal input terminal 10, the pull-up output unit 20, the pull-down output unit 30, the compensation unit, the pulse signal generation circuit, the pull-up pre-amplification unit 71 and the pull-down pre-amplification unit 72 are the same as those described above, and are not described in detail.

The present application further provides a memory including the output driving circuit as described above. The memory includes, but is not limited to, a DDR4, an LPDDR4, an LPDDR4X, an LPDDR5 and other DRAMs in need of high-speed data transmission.

The above descriptions are only preferred implementations of the present application. It should be pointed out that, those of ordinary skill in the art may further make several improvements and modifications without departing from the principle of the present application. Such improvements and modifications should also fall within the protection scope of the present application.

What is claimed is:

1. An output driving circuit, comprising:
a signal input terminal inputting a positive input signal and a negative input signal complementary to each other;
a pull-up output unit connected to the signal input terminal, the positive input signal acting as an input signal of the pull-up output unit;
a pull-down output unit connected to the signal input terminal, the negative input signal acting as an input signal of the pull-down output unit;
at least one compensation unit connected in parallel with the pull-up output unit or the pull-down output unit;
at least one pulse signal generation circuit having an input terminal connected to the signal input terminal, and generating a pulse signal based on the positive input signal or the negative input signal, the pulse signal acting as a control signal of the compensation unit; and
a signal output terminal connected to an output terminal of the pull-up output unit, an output terminal of the pull-down output unit and an output terminal of the compensation unit, and outputting an output signal;
wherein the output driving circuit further comprises a pull-up pre-amplification unit and a pull-down pre-amplification unit; the pull-up pre-amplification unit comprises a first terminal and a second terminal, the first terminal of the pull-up pre-amplification unit is connected to the positive input signal, and the second terminal of the pull-up pre-amplification unit is connected to a control terminal of the pull-up output unit; the pull-down pre-amplification unit comprises a first terminal and a second terminal, the first terminal of the pull-down pre-amplification unit is connected to the negative input signal, the second terminal of the pull-down pre-amplification unit is connected to a control terminal of the pull-down output unit, and the input terminal of the pulse signal generation circuit is connected to the second terminal of the pull-up pre-amplification unit or the second terminal of the pull-down pre-amplification unit.

2. The output driving circuit according to claim 1, wherein a pulse width of the pulse signal is less than that of the positive input signal or the negative input signal.

3. The output driving circuit according to claim 1, wherein the pulse signal generation circuit generates the pulse signal through a rising edge or a falling edge of the positive input signal or the negative input signal.

4. The output driving circuit according to claim 1, wherein a pulse width of the pulse signal is less than or equal to a rising edge time or a falling edge time of the output signal.

5. The output driving circuit according to claim 1, wherein the pulse signal generation circuit comprises a first delay branch, a second delay branch and an AND circuit, the first delay branch is connected in parallel with the second delay branch and then connected in series with the AND circuit, the positive input signal or the negative input signal acts as input signals of the first delay branch and the second delay branch, output signals of the first delay branch and the second delay branch act as an input signal of the AND circuit together, the AND circuit outputs the pulse signal, and the first delay branch and the second delay branch have different delay times.

6. The output driving circuit according to claim 5, wherein the first delay branch comprises at least a NOT gate and a first delay unit connected in series, the second delay branch comprises at least a second delay unit, and the delay times of the first delay unit and the second delay unit are adjusted to change a pulse width of the pulse signal.

7. The output driving circuit according to claim 1, wherein the output driving circuit further comprises at least one delay unit, the delay unit is arranged at the input terminal of the pulse signal generation circuit, and the positive input signal or the negative input signal is inputted to the pulse signal generation circuit through the delay unit.

8. The output driving circuit according to claim 1, wherein the output driving circuit comprises two compensation units that are a pull-up compensation unit and a pull-down compensation unit respectively, the pull-up compensation unit is connected in parallel with the pull-up output unit, and the pull-down compensation unit is connected in parallel with the pull-down output unit.

9. The output driving circuit according to claim 8, wherein the output driving circuit comprises two pulse signal generation circuits that are a pull-up pulse signal generation circuit and a pull-down pulse signal generation circuit respectively, the pull-up pulse signal generation circuit generates a first pulse signal based on the positive input signal, the first pulse signal acts as a control signal of the pull-up compensation unit, the pull-down pulse signal generation circuit generates a second pulse signal based on the negative input signal, and the second pulse signal acts as a control signal of the pull-down compensation unit.

10. The output driving circuit according to claim 8, wherein the pull-up output unit comprises one first transistor or a plurality of first transistors arranged in parallel, the first transistor comprising a first terminal, a second terminal and a control terminal; the pull-up compensation unit comprises one second transistor or a plurality of second transistors arranged in parallel, the second transistor comprising a first terminal, a second terminal and a control terminal; the first terminals of the first transistor and the second transistor are connected to a power supply voltage, the second terminals of the first transistor and the second transistor are connected to the signal output terminal, the control terminal of the first transistor is connected to the signal input terminal, and the control terminal of the second transistor is connected to a pull-up pulse signal generation circuit.

11. The output driving circuit according to claim 8, wherein the pull-down output unit comprises one third transistor or a plurality of third transistors arranged in parallel, the third transistor comprising a first terminal, a second terminal and a control terminal; the pull-down compensation unit comprises one fourth transistor or a plurality of fourth transistors arranged in parallel, the fourth transistor comprising a first terminal, a second terminal and a control terminal; the first terminals of the third transistor and the fourth transistor are grounded, the second terminals of the third transistor and the fourth transistor are connected to the signal output terminal, the control terminal of the third transistor is connected to the signal input terminal, and the control terminal of the fourth transistor is connected to a pull-down pulse signal generation circuit.

12. The output driving circuit according to claim 1, wherein the output driving circuit further comprises a pull-up impedance calibration unit and a pull-down impedance calibration unit, the pull-up impedance calibration unit is connected in parallel with the pull-up output unit, and the pull-down impedance calibration unit is connected in parallel with the pull-down output unit.

13. The output driving circuit according to claim 1, wherein the output driving circuit comprises a plurality of parallel driving modules, each of the plurality of driving modules comprising at least the signal input terminal, the pull-up output unit, the pull-down output unit, the compensation unit and the signal input terminal.

14. The output driving circuit according to claim 13, wherein the plurality of driving modules share the same pulse signal generation circuit.

15. A memory, comprising the output driving circuit according to claim 1.

16. An output driving circuit, comprising:
a signal input terminal inputting a positive input signal and a negative input signal complementary to each other;
a pull-up output unit connected to the signal input terminal, the positive input signal acting as an input signal of the pull-up output unit;
a pull-down output unit connected to the signal input terminal, the negative input signal acting as an input signal of the pull-down output unit;
at least one compensation unit connected in parallel with the pull-up output unit or the pull-down output unit;
at least one pulse signal generation circuit having an input terminal connected to the signal input terminal, and generating a pulse signal based on the positive input signal or the negative input signal, the pulse signal acting as a control signal of the compensation unit; and
a signal output terminal connected to an output terminal of the pull-up output unit, an output terminal of the pull-down output unit and an output terminal of the compensation unit, and outputting an output signal;
wherein the output driving circuit further comprises a pull-up impedance calibration unit and a pull-down impedance calibration unit, the pull-up impedance calibration unit is connected in parallel with the pull-up output unit, and the pull-down impedance calibration unit is connected in parallel with the pull-down output unit.

17. An output driving circuit, comprising:
a signal input terminal inputting a positive input signal and a negative input signal complementary to each other;
a pull-up output unit connected to the signal input terminal, the positive input signal acting as an input signal of the pull-up output unit;
a pull-down output unit connected to the signal input terminal, the negative input signal acting as an input signal of the pull-down output unit;
at least one compensation unit connected in parallel with the pull-up output unit or the pull-down output unit;
at least one pulse signal generation circuit having an input terminal connected to the signal input terminal, and generating a pulse signal based on the positive input signal or the negative input signal, the pulse signal acting as a control signal of the compensation unit; and
a signal output terminal connected to an output terminal of the pull-up output unit, an output terminal of the pull-down output unit and an output terminal of the compensation unit, and outputting an output signal;
wherein the output driving circuit comprises a plurality of parallel driving modules, each of the plurality of driving modules comprising at least the signal input terminal, the pull-up output unit, the pull-down output unit, the compensation unit and the signal input terminal, and the plurality of driving modules share the same pulse signal generation circuit.

\* \* \* \* \*